United States Patent
Imanaka et al.

(10) Patent No.: US 10,968,513 B2
(45) Date of Patent: Apr. 6, 2021

(54) PLASMA FILM-FORMING APPARATUS AND SUBSTRATE PEDESTAL

(71) Applicant: Tokyo Electron Limited, Tokyo (JP)

(72) Inventors: Masashi Imanaka, Yamanashi (JP); Toshio Nakanishi, Yamanashi (JP); Minoru Honda, Yamanashi (JP); Koji Kotani, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 232 days.

(21) Appl. No.: 15/627,689

(22) Filed: Jun. 20, 2017

(65) Prior Publication Data

US 2017/0369996 A1 Dec. 28, 2017

(30) Foreign Application Priority Data

Jun. 24, 2016 (JP) .............................. JP2016-125141

(51) Int. Cl.
*H01J 37/32* (2006.01)
*C23C 16/44* (2006.01)
(Continued)

(52) U.S. Cl.
CPC ........ *C23C 16/4412* (2013.01); *C23C 16/345* (2013.01); *C23C 16/455* (2013.01);
(Continued)

(58) Field of Classification Search
CPC ..... C23C 16/345; C23C 16/511; C23C 16/46; C23C 16/458; C23C 16/455;
(Continued)

(56) References Cited

U.S. PATENT DOCUMENTS 6,364,957 B1 * 4/2002 Schneider ........... C23C 16/4585
118/500
6,372,084 B2 * 4/2002 Hongo .................. C23C 16/511
118/723 ME
(Continued)

FOREIGN PATENT DOCUMENTS

JP 2001-060557 A 3/2001
JP 2001-274149 A 10/2001
(Continued)

*Primary Examiner* — Yuechuan Yu
(74) *Attorney, Agent, or Firm* — Abelman, Frayne & Schwab (57) ABSTRACT

Provided is a plasma film-firming apparatus including: a chamber configured to accommodate a substrate therein; a substrate pedestal configured to disposed the substrate thereon within the chamber; a gas supply mechanism configured to supply a gas including a film-forming gas into the chamber; an exhaust mechanism configured to exhaust an inside of the chamber; and a plasma generating unit configured to generate plasma in the chamber. The substrate pedestal includes a pedestal body having a smaller diameter than that of the substrate and including a placement surface, and an annular adjustment member disposed outside the pedestal body. The adjustment member is replaceably installed. A plurality of adjustment members having various steps are provided at a position outside the substrate as the adjustment member, and among the plurality of adjustment members, an adjustment member is selected and used according to a processing condition of a plasma processing.

20 Claims, 6 Drawing Sheets

(51) Int. Cl.
*H01L 21/687* (2006.01)
*C23C 16/458* (2006.01)
*C23C 16/34* (2006.01)
*C23C 16/455* (2006.01)
*C23C 16/46* (2006.01)
*C23C 16/511* (2006.01)
*H01L 21/02* (2006.01)

(52) U.S. Cl.
CPC ........ *C23C 16/458* (2013.01); *C23C 16/4585* (2013.01); *C23C 16/46* (2013.01); *C23C 16/511* (2013.01); *H01J 37/3244* (2013.01); *H01J 37/32192* (2013.01); *H01J 37/32642* (2013.01); *H01J 37/32724* (2013.01); *H01L 21/0217* (2013.01); *H01L 21/02274* (2013.01); *H01L 21/68735* (2013.01)

(58) Field of Classification Search
CPC ............ C23C 16/4585; C23C 16/4412; H01L 21/0217; H01L 21/02274; H01L 21/68735; H01J 37/32192; H01J 37/3244; H01J 37/32642; H01J 37/32724
See application file for complete search history.

(56) References Cited

U.S. PATENT DOCUMENTS

| | | | | |
|---|---|---|---|---|
| 2004/0083975 | A1* | 5/2004 | Tong | H01J 37/32623 118/728 |
| 2005/0191811 | A1* | 9/2005 | Ogihara | C23C 16/4585 438/296 |
| 2009/0266299 | A1 | 10/2009 | Rasheed et al. | |
| 2010/0040768 | A1* | 2/2010 | Dhindsa | H01J 37/32642 427/8 |

FOREIGN PATENT DOCUMENTS

| | | |
|---|---|---|
| JP | 2005-251800 A | 9/2005 |
| JP | 2009-246129 A | 10/2009 |
| KR | 10-2010-0063800 A1 | 6/2010 |
| WO | 2009-008474 A | 1/2009 |

* cited by examiner

PLASMA FILM-FORMING APPARATUS AND SUBSTRATE PEDESTAL

CROSS-REFERENCE TO RELATED APPLICATIONS

This application is based on and claims priority from Japanese Patent Application No. 2016-125141 filed on Jun. 24, 2016 with the Japan Patent Office, the disclosure of which is incorporated herein in its entirety by reference.

TECHNICAL FIELD

The present disclosure relates to a plasma film-forming apparatus and a substrate pedestal.

BACKGROUND

In a semiconductor device manufacturing process, various films are formed as, for example, an insulation film, a protective film, and an electrode film. As a method of forming the films, plasma chemical vapor deposition (CVD) is known, which excites a film-forming gas by plasma so as to deposit a predetermined film on a substrate.

For example, Japanese Patent Laid-Open Publication No. 2009-246129 discloses forming a silicon nitride film on a semiconductor wafer by plasma CVD using microwave plasma by disposing the semiconductor wafer as a substrate on a susceptor provided in a chamber, supplying, as a film-forming gas, a silicon raw material gas and a nitrogen-containing gas into the chamber, and further supplying a plasma generating gas (diluted gas).

Meanwhile, it has been known that that when a plasma processing is performed, the condition of plasma on the outermost periphery of a substrate is different from that on the other portions of the substrate and as a result, the processing rate in the outermost periphery of the substrate is different from that in the other portions (see, International Publication No. WO2009/008474).

Therefore, in a plasma film-forming processing such as, for example, plasma CVD, in-plane film-thickness uniformity is secured in the related art by controlling the flow of the film-forming gas or the plasma generating gas (diluted gas), or controlling the distribution of plasma.

SUMMARY

A first aspect of the present disclosure provides a film-forming apparatus including: a chamber configured to accommodate a substrate therein; a substrate pedestal configured to dispose the substrate thereon within the chamber; a gas supply mechanism configured to supply a gas including a film-forming gas into the chamber; an exhaust mechanism configured to evacuate an inside of the chamber; and a plasma generating unit configured to generate a plasma in the chamber. A predetermined film is formed on the substrate by exciting the film-forming gas by the plasma generated by the plasma generating unit. The substrate pedestal includes a pedestal body having a smaller diameter than that of the substrate and including a placement surface, and an annular adjustment member disposed outside the pedestal body. The adjustment member is replaceably installed, and a plurality of adjustment members having various steps are provided at a position outside the substrate to be used as the adjustment member, and among the plurality of adjustment members, an adjustment member is selected and used according to a processing condition of a plasma processing.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 6A and 6B are views illustrating susceptors used in a test example, in which FIG. 6A illustrates a conventional susceptor, and FIG. 6B illustrates a susceptor having an adjustment member that is formed with a stepped portion X (mm).

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

However, recently, since a reduction in the size of semiconductor devices has progressed and the demand for film thickness uniformity in the film-forming processing has been increased, it becomes difficult to obtain desired film thickness uniformity by simply controlling the flow of the film-forming gas or plasma generating gas (diluted gas) and controlling the distribution of plasma.

Therefore, the present disclosure provides a plasma film-forming apparatus capable of obtaining a film having desired film thickness uniformity and a substrate pedestal used in the plasma film-forming apparatus.

A first aspect of the present disclosure provides a film-forming apparatus including: a chamber configured to accommodate a substrate therein; a substrate pedestal configured to dispose the substrate thereon within the chamber; a gas supply mechanism configured to supply a gas including a film-forming gas into the chamber; arm exhaust mechanism configured to evacuate an inside of the chamber; and a plasma generating unit configured to generate a plasma in the chamber. A predetermined film is formed on the substrate by exciting the film-forming gas by the plasma generated by the plasma generating unit. The substrate pedestal includes a pedestal body having a smaller diameter than that of the substrate and including a placement surface, and an annular adjustment member disposed outside the pedestal body. The adjustment member is replaceably installed, and a plurality of adjustment members having various steps are provided at a position outside die substrate to be used as the adjustment member, and, among the plurality of adjustment members, an adjustment member is selected and used according to a processing condition of a plasma processing.

A second aspect of the present disclosure provides a substrate pedestal configured to place a substrate thereon within a chamber of a plasma film-forming apparatus that forms a predetermined film on the substrate. The substrate pedestal includes: a pedestal body having a smaller diameter than that of the substrate and including a placement surface and an annular adjustment member disposed outside the pedestal body. The adjustment member is replaceably installed, a plurality of adjustment members having various steps are provided at a position outside the substrate to be used as the adjustment member, and among the plurality of adjustment members, an adjustment member is selected and used according to a processing condition of a plasma processing.

In the present disclosure, a plasma generating unit configured to generate a microwave plasma in the chamber may be suitably used as the plasma generating unit. A plasma generating unit including a microwave generating device configured to generate microwaves, a planar antenna having a slot configured to radiate the microwaves, and a microwave transmitting plate formed of a dielectric material that constitutes a ceiling wall of the chamber may be used as the plasma generating unit. The microwave plasma may be generated in the chamber by radiating the microwave into the chamber through the slot of the planar antenna and the microwave transmitting plate to supply the microwaves into the chamber.

The pedestal body may have a heater unit configured to heat the substrate. The gas supply mechanism may use a hydrogen-containing gas as the film-forming gas. In this case, the film-forming gas may include a hydrogen-containing silicon raw material as the hydrogen-containing gas, and a silicon-containing film may be formed as the predetermined film. In addition, as the film-forming gas, the hydrogen-containing silicon raw material and the nitrogen-containing gas may be supplied, and a silicon nitride film may be formed as the predetermined film. In this case, a temperature of the substrate may be controlled to a range of 250° C. to 550° C.

The gas supply mechanism may supply helium gas as a plasma generating gas into the chamber together with the film-forming gas.

According to the present disclosure, a substrate pedestal including a pedestal body having a smaller diameter than that of the substrate and including a placement surface and an annular adjustment member disposed outside the pedestal body may be used as the substrate pedestal. The adjustment member is replaceably installed. In addition, a plurality of adjustment members having various steps are provided a position outside the substrate to be used as the adjustment member, and among the plurality of adjustment members, an adjustment member is selected and used according to a processing condition of a plasma processing. Therefore, a film having desired film thickness uniformity can be obtained.

Hereinafter, exemplary embodiments of the present disclosure will be described in detail with reference to the accompanying drawings <Configuration of Plasma Film-Forming Apparatus>

Figure 1:
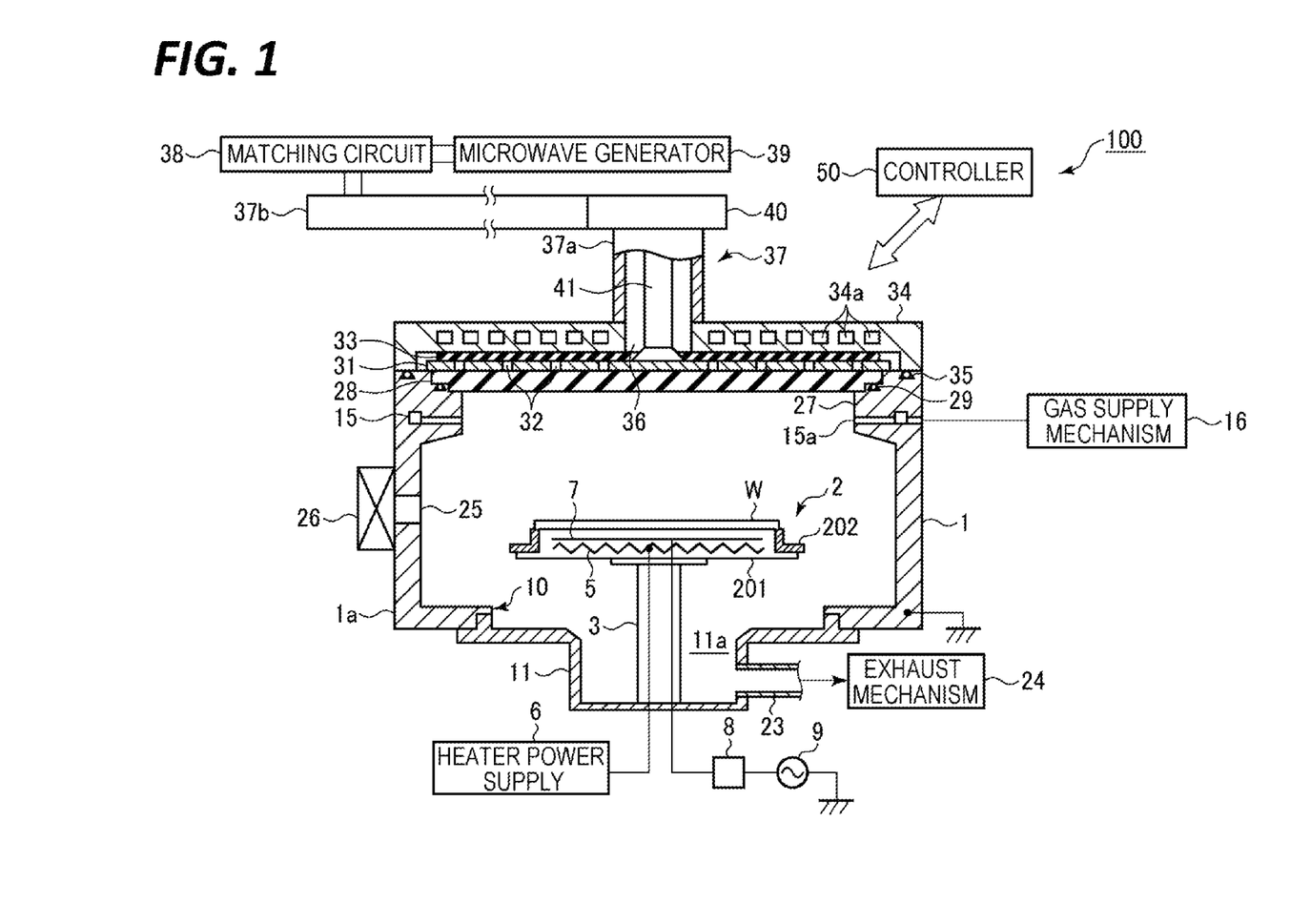
FIG. 1 is a cross-sectional view illustrating a plasma film-forming apparatus according to an exemplary embodiment of the present disclosure.

FIG. 1 is a cross-sectional view illustrating a plasma film-forming apparatus according to an exemplary embodiment of the present disclosure. The plasma film-forming apparatus of FIG. 1 is configured as an RLSA (registered trademark) microwave plasma film-forming apparatus, and forms a silicon nitride (SiN) film by plasma CVD on a semiconductor wafer (hereinafter, simply referred to as "wafer") such as, for example, a silicon wafer as a substrate to be processed.

As illustrated in FIG. 1, the plasma film-forming apparatus 100 includes a substantially cylindrical chamber 1, which is hermetically configured and grounded. A circular opening 10 is formed substantially in the center portion of the bottom wall 1a of the chamber 1, and the bottom wall 1a is provided with an exhaust chamber 11, which communicates with the opening 10 and protrudes downward.

A susceptor 2 is provided in the chamber 1 and serves as a substrate pedestal for horizontally supporting a wafer W, which is a substrate to be processed. The susceptor 2 includes a susceptor body 201 and an annular adjustment member 202 provided on the outer periphery of the susceptor body 201. The susceptor body 201 is supported by a cylindrical support member 3, which extends upward from the center of the bottom of the exhaust chamber 11. A resistive-heating-type heater 5 is buried in the susceptor body 201. The heater 5 heats the susceptor body 201 by receiving power supplied from a heater power supply 6, and heats the wafer W via the susceptor body 201. In addition, an electrode 7 is buried in the susceptor body 201, and a high-frequency power supply 9 for applying a bias is connected to the electrode 7 via a matcher 8. Details of the susceptor 2 will be described later.

An annular gas introduction portion 15 is provided on the sidewall of the chamber 1, and gas ejection holes 15a are equidistantly formed in the gas introduction portion 15. A gas supply mechanism 16 is connected to the gas introduction portion 15.

The gas supply mechanism 16 is configured to supply a Si raw material gas containing hydrogen (H), a nitrogen-containing gas, and a plasma generating gas. Monosilane ($SiH_4$) or disilane ($Si_2H_6$) is used as the Si raw material gas containing H, $N_2$ gas or ammonia ($NH_3$) is used as the nitrogen-containing gas, and a rare gas such as, for example, Ar gas or He gas is used as the plasma generating gas. These gases are supplied from respective gas supply sources to the gas introduction portion 15 via separate pipes, and the flow rates thereof are independently controlled by flow-rate controllers such as, for example, mass flow controllers.

In addition, below the gas introduction portion 15, a separate gas introduction portion (e.g., a shower plate) is provided. A gas, which may not be completely dissociated by plasma, such as, for example, a silicon raw material gas, may be supplied from the separate gas introduction portion to an region, which is closer to the wafer W and has a lower electron temperature.

An exhaust pipe 23 is connected to the side surface of the exhaust chamber 11, and an exhaust mechanism 24, which includes, for example, a vacuum pump or an automatic pressure control valve, is connected to the exhaust pipe 23. When the vacuum pump of the exhaust mechanism 24 is operated, the gas in the chamber 1 is uniformly discharged into a space 11a in the exhaust chamber 11 and is exhausted through the exhaust pipe 23. The inside of the chamber 1 may be controlled to a predetermined degree of vacuum by the automatic pressure control valve.

The sidewall of the chamber 1 is provided with a carry-in/out port 25, which is used to perform the carry-in/out of the wafer W between the chamber 1 and a transportation chamber (not illustrated) adjacent to the plasma film-forming apparatus 100, and is also provided with a gate valve 26, which opens and closes the carry-in out port 25.

The upper portion of the chamber 1 forms an opening, and the peripheral portion of the opening forms a ring-shaped support portion 27. A disc-shaped microwave transmitting plate 28, which is formed of a dielectric material, for example, ceramics (e.g., quartz or $Al_2O_3$), is air tightly mounted on the support portion 27 via a sealing member 29. Thus, the inside of the chamber 1 is airtightly maintained.

Above the microwave transmitting plate 28, a planar antenna 31, which has a disc shape to correspond to the microwave transmitting plate 28, is provided so as to come into close contact with the microwave transmitting plate 28. The planar antenna 31 is engaged with the upper end of the sidewall of the chamber 1. The planar antenna 31 is configured as a disc formed of a conductive material.

The planar antenna 31 is formed of, for example, a copper or aluminum plate having a silver- or gold-plated surface, and is configured such that multiple slots 32 for radiating microwaves penetrate therethrough. In an exemplary pattern of the slots 32, two slots 32 arranged in T shape form one pair and multiple pairs of slots 32 may be concentrically arranged. The length and arrangement interval of the slots 32 are determined according to the wavelength ($\lambda$g) of the microwaves. For example, the slots 32 are arranged such that the interval thereof is $\lambda$g/4, $\lambda$g/2, or $\lambda$g. In addition, the slots 32 may have any other shape such as, for example, a circular shape or an arc shape. Further, the arrangement form of the slots 32 is not particularly limited, and may be arranged in a spiral form or a radial form, rather than in the concentric form.

On the upper surface of the planar antenna 31, a slow-wave plate 33, which is formed of a dielectric material having a dielectric constant larger than that of vacuum (e.g., quartz, polytetrafluoroethylene or polyimide), is provided to be in close contact therewith. The slow-wave plate unction of making the wavelength of microwaves shorter than that in the vacuum, thereby reducing the size of the planar antenna 31.

The planar antenna 31 and the microwave transmitting plate 28 are in close contact with each other, and the slow-wave plate 33 and the planar antenna 31 are also in close contact with each other. In addition, the thicknesses of the microwave transmitting plate 28 and the slow-wave plate 33 are adjusted to allow an equivalent circuit, which is formed by the slow-wave plate 33, the planar antenna 31, the microwave transmitting plate 28, and plasma, to satisfy the resonance condition. By adjusting the thickness of the slow-wave plate 33, the phase of microwaves may be adjusted, and by adjusting the thickness so that a bonding portion of the planar antenna 31 becomes the "antinode" of standing waves, microwave reflection may be minimized and microwave radiation energy may be maximized. In addition, when the slow-wave plate 33 and the microwave transmitting plate 28 are formed of the same material, interface reflection of microwaves may be suppressed.

In addition, the planar antenna 31 and the microwave transmitting plate 28 may be spaced apart from each other, and the slow-wave plate 33 and the planar antenna 31 may also be spaced apart from each other.

On the upper surface of the chamber 1, a shield lid 34, which is formed of a metal material (e.g., aluminum, stainless steel, or copper), is provided so as to cover the planar antenna 31 and the slow-wave plate 33. The upper surface of the chamber 1 and the shield cover 34 are sealed by a seal member 35. A cooling water flow path 34a is formed in the shield cover 34. When cooling water flows through the shield cover 34, the shield cover 34, the slow-wave plate 33, the planar antenna 31, and the microwave transmitting plate 28 are cooled. In addition, the shield cover 34 is grounded.

An opening 36 is formed in the center of the upper wall of the shield cover 34, and a waveguide 37 is connected to the opening. A microwave generator 39 is connected to the end of the waveguide 37 via a matching circuit 38. Therefore, microwaves having a frequency of, for example, 2.45 GHz and generated by the microwave generator 39 propagate to the planar antenna 31 via the waveguide 37. In addition, the frequency of the microwaves may have any other value such as, for example, 8.35 GHz, 1.98 GHz, 860 MHz, or 915 MHz.

The waveguide 37 includes a coaxial waveguide 37a, which has a circular cross section and extends upward from the opening 36 of the shield cover 34, and a rectangular waveguide 37b, which is connected to the upper end of the coaxial waveguide 37a via a mode converter 40 and extends in the horizontal direction. The mode converter 40 between the rectangular waveguide 37b and the coaxial waveguide 37a has a function of converting the microwaves, which propagate in a TE mode through the inside of the rectangular waveguide 37b, to a TEM mode. An inner conductor 41 extends in the center of the coaxial waveguide 37a, and the lower end of the inner conductor 41 is connected and fixed to the center of the planar antenna 31. Therefore, the microwaves propagate uniformly and efficiently to the planar antenna 31 via the inner conductor 41 in the coaxial waveguide 37a.

The plasma film-forming apparatus 100 includes a control unit 50. The control unit 50 includes a main control unit having a CPU (a computer) to control the respective components of the plasma film-forming apparatus 100 such as, for example, the microwave generator 39, the heater power supply 6, the high-frequency power supply 9, the exhaust mechanism 24, and the valve or the flow-rate controller of the gas supply mechanism 16, an input device (e.g., a keyboard or a mouse), an output device (e.g., a printer), a display device (e.g., a display), and a storage device (a storage medium). The main control unit f the control unit 50 causes the plasma film forming apparatus 100 to execute a predetermined operation based on, for example, a processing recipe stored in the storage medium mounted in the storage device or the storage medium set in the storage device.

<Configuration of Susceptor (Substrate Pedestal)>

As described above, the susceptor (substrate pedestal) 2 includes a susceptor body 201 and an annular adjustment member 202 replaceably installed on the outer periphery of the susceptor body 201. Both the susceptor body 201 and the adjustment member 202 are formed of the same material. For example, the susceptor body 201 and the adjustment member 202 are formed of ceramics such as, for example, AlN.

Figure 2:
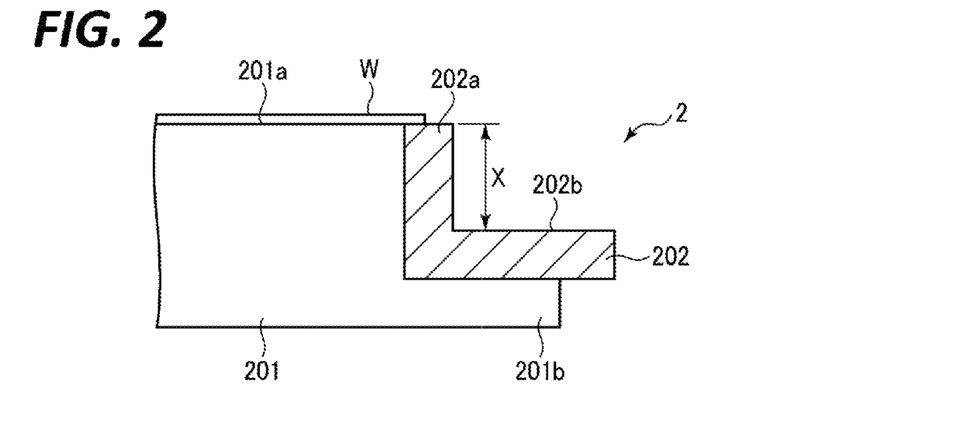
FIG. 2 is a cross-sectional view illustrating a susceptor (substrate pedestal) on which a substrate is disposed in the plasma film-forming apparatus of FIG. 1.

As illustrated in FIG. 2, the peripheral portion of the susceptor body 201 is notched in a ring shape, and the susceptor body 201 has a placement surface 201a having a smaller diameter than the wafer W on the upper surface thereof. The wafer W is placed such that the outer edge portion thereof protrudes from the placement surface 201a. At this time, the wafer W may be spaced apart from the placement surface by about several millimeters by a spacer (not illustrated).

The annular adjustment member 202 is disposed around the susceptor body 201 and is supported on a flange portion 201b formed on the peripheral portion of the susceptor body 201. Multiple types of adjustment members having different shapes are prepared in advance so that one having a desired shape may be selected according to a processing.

Figure 3:
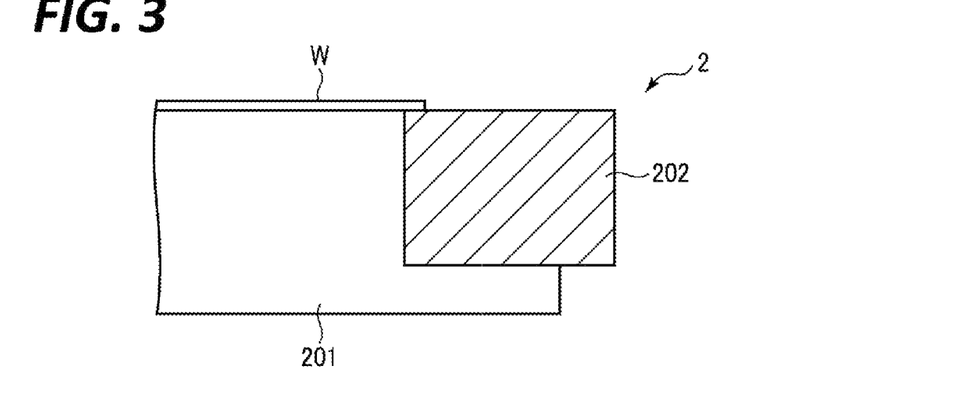
FIG. 3 is a cross-sectional view illustrating an example of using a susceptor (substrate pedestal) on which a substrate is disposed, which does not have a stepped portion.
Figure 4:
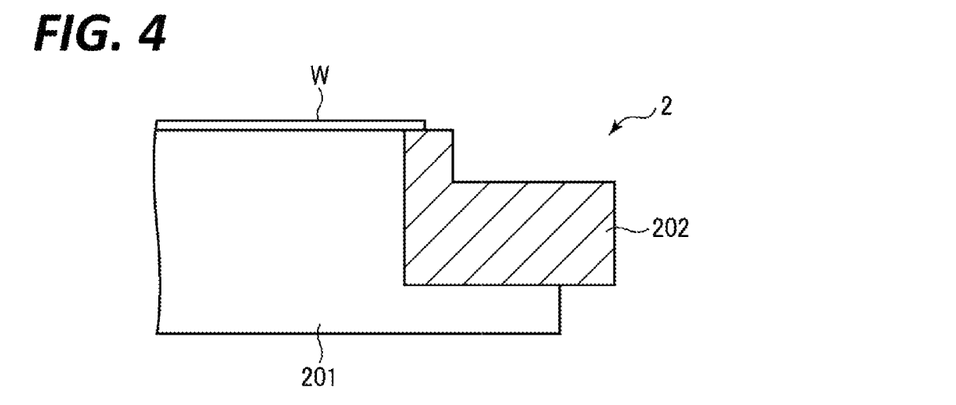
FIG. 4 is a cross-sectional view illustrating an example of using a susceptor (substrate pedestal) on which a substrate is disposed, which has a stepped portion between those of FIG. 2 and FIG. 3.

Multiple types of adjustment members 202 are prepared, which have various steps X with respect to the placement surface 201a of the susceptor body 201. For example, the stepped portion X may be adjusted within a range from −15 mm to +1 mm. The "−15 mm" refers to a position that is 15 mm lower than the placement surface 201a of the susceptor 201, and the "+1 mm" refers to a position that is 1 mm higher than the placement surface 201a. When the stepped portion X is at 0 mm, as illustrated in FIG. 3, the stepped portion X extends to the outside of the wafer W at the same height as the placement surface 201a, and has the same function as a conventional susceptor. FIG. 4 illustrates an example in which the stepped portion X is lower than that in FIG. 2. In order to appropriately control the film thickness on the outermost peripheral portion of the wafer W, the stepped portion X may be located lower than the placement surface 201a, and may range from about −15 mm to about −4 mm. When the stepped portion X is located lower than the placement surface 201a, as illustrated in FIG. 2, the adjustment member 202 includes an inner peripheral portion 202a having the same height as the placement surface 201a and an outer peripheral portion 202b that is located lower than the placement surface 201a by X, the stepped portion X being formed therebetween. The position of the stepped portion may be 1 mm to 2 mm outside the outer edge of the wafer W.

Figure 5:
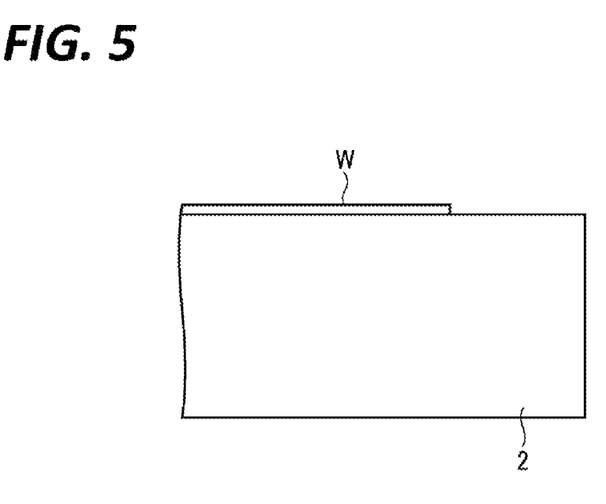
FIG. 5 is a cross-sectional view illustrating a susceptor (substrate pedestal) in a conventional plasma film-forming apparatus.

As illustrated in FIG. 5, in the related art, the susceptor 2, which is used when forming a film such as, for example, a SiN film, has a larger diameter than the wafer W, the placement surface 201a extends to the outside of the wafer W, and the adjustment of a stepped portion is impossible. In this case, the temperature of the susceptor 2 has been raised to 250° C. to 550° C., for example, 320° C. by a heater, and the temperature of the wafer W is lower than that of the susceptor 2 when plasma does not exist. On the other hand, when plasma is generated, the temperature of the wafer W is higher than that of the susceptor 2 due to heat input from the plasma. Therefore, a temperature difference occurs between the wafer W and the susceptor 2, the molecules of a Si raw material gas thermally diffuse from the outer periphery of the wafer W to the susceptor, and due to the Soret effect, a concentration gradient in which the concentration of the Si raw material is low at the outer peripheral portion of the wafer occurs. The Soret effect is remarkable in hydrogen (H), and is likely to occur in an H-containing raw material such as, for example, $SiH_4$ or $Si_2H_6$ used in the present exemplary embodiment.

The nonuniformity of the film thickness on the outermost peripheral portion of the wafer W due to, for example, the Sole effect may be suppressed by controlling thermal diffusion by adjusting the stepped portion on the outermost peripheral portion of the susceptor 2.

Therefore, in the present exemplary embodiment, the susceptor 2 including a susceptor body 201 having a diameter smaller than that of the wafer W and an annular adjustment member 202 replaceably installed on the outer periphery of the susceptor body 201 is used, and multiple types of adjustment members 202 having various steps X are prepared such that one having a desired stepped portion X is selected according to a processing.

<Operation of Plasma Film-Forming Apparatus>

Next, a processing operation of the plasma film forming apparatus 100 configured as described above will be described.

First, the gate valve 26 is opened, and a wafer W, which is an object to be processed, is carried into the chamber 1 from the carry-in/out port 25 and is disposed on the susceptor body 201 of the susceptor 2. At this time, the susceptor body 201 is controlled to a predetermined temperature.

Next, the inside of the chamber 1 is adjusted to a predetermined pressure, and a Si raw material gas such as, for example, $SiH_4$ gas, and a nitrogen-containing gas such as, for example, $N_2$ gas are introduced into the chamber 1 from the gas supply mechanism 16 via the gas introduction unit 15. In addition, a rare gas such as, for example, Ar gas or He gas is introduced as a plasma generating gas as needed. Then, microwaves having a predetermined power are introduced from the microwave generator 39 into the chamber 1 so as to generate plasma, and a SiN film is formed on the wafer W by plasma CVD.

Specifically, the microwaves having a predetermined power and generated from the microwave generator 39 are guided to the waveguide 37 by way of the matching circuit 38. The microwaves guided to the waveguide 37 propagate in a TE mode via the rectangular waveguide 37b. The microwaves in the TE mode are converted into a TEM mode by the mode converter 40, and the microwaves in the TEM mode propagate in the TEM mode via the coaxial waveguide 37a. Then, the microwaves in the TEM mode pass through the slow-wave plate 33, the slots 32 of the planar antenna 31, and the microwave transmitting plate 28 to thereby be radiated into the chamber 1.

The microwaves are surface waves and diffuse only to a region directly under the microwave transmitting plate 28, whereby surface wave plasma is generated. Then, the plasma diffuses downward, and in the region in which the wafer W is disposed, the plasma has a high electron density and a low electron temperature.

The Si raw material gas and the nitrogen-containing gas are excited by the plasma and are dissociated into active species such as, for example, SiH and NH. The active species react on the wafer W so that a SiN film is formed.

At this time, as described above, the temperature of the susceptor 2 is raised to 250° C. to 550° C., for example, 320° C. by a heater, and the temperature of the wafer W is lower than that of the susceptor 2 when plasma does not exist. On the other hand, when plasma is generated, the temperature of the wafer W is higher than that of the susceptor 2 due to heat input from the plasma. Therefore, since a temperature difference occurs between the wafer W and the susceptor 2, when the stepped portion on the outer peripheral portion of the susceptor 2 is not adjusted, the molecules of the Si raw material gas thermally diffuse from the outer periphery of the wafer W to the susceptor, and due to the Soret effect, a concentration gradient in which the concentration of the Si raw material is low on the outer peripheral portion of the wafer W may occur. The Soret effect is remarkable when an H-containing raw material such as, for example, $SiH_4$ or $Si_2H_6$ is used as a raw material gas as in the present exemplary embodiment. When such a concentration gradient occurs, in many cases, the film thickness on the outermost peripheral portion of the wafer W is reduced.

In the related art, although the adjustment of the film thickness on the outermost peripheral portion of the wafer W has been performed by controlling the flow of a film-forming gas or a plasma generating gas (diluted gas) or by controlling the distribution of plasma, it is difficult to satisfy the recent high requirement of film thickness uniformity only by the adjustment.

While the nonuniformity of the film thickness on the outermost peripheral portion of the wafer W due to, for example, the Sole effect may be suppressed by controlling thermal diffusion by adjusting the stepped portion on the outermost peripheral portion of the susceptor 2, it is difficult to properly control the film thickness according to a processing merely by forming a predetermined stepped portion on the outermost peripheral portion of the susceptor 2.

Therefore, in the present exemplary embodiment, the susceptor 2 is constituted with a susceptor body 201 and an annular adjustment member 202 replaceably installed on the outer periphery of the susceptor body 201, and multiple types of adjustment members 202 having various steps X are prepared so that one having a desired stepped portion X is selected according to a processing.

In this way, by selecting an appropriate adjustment member 202 according to the nonuniformity of the film thickness on the outermost peripheral portion of the wafer W, the film thickness of the wafer W may remain uniform regardless of processing conditions.

However, a plasma generating gas, which includes a rare gas supplied together with a film-forming gas, has been used in the related art in order to stably generate plasma. Among the rare gases, Ar gas, which is advantageous in terms of a cost and an industrial purpose, is frequently used. Other rare gases are considered to have the same function as Ar gas, and rare gases other than Ar gas have been rarely used in the related art.

However, when Ar gas is used as a plasma generating gas, it has been found that the Ar gas is difficult to diffuse uniformly because Ar has a large atomic weight, and as a result, plasma tends to become nonuniform. On the other hand, He gas functions as a plasma generating gas because the He gas is easily ionized. Further, because He is a light element having a small atomic weight, the He gas is easily diffused, and as a result, the He gas diffuses the plasma to be uniformized and easily uniformizes the film thickness.

Therefore, as described above, when the adjustment member 202 of the susceptor 2 having an appropriate stepped portion X is selected and He gas is used as the plasma generating gas, the uniformity of the film thickness may be further increased.

In addition, when Ar gas is used as a plasma generating gas, the film quality may be deteriorated due to plasma damage because Ar has a large atomic weight. However, He has a smaller atomic weight than Ar, and as a result, He gas hardly gives plasma damage, unlike Ar gas. Therefore, when He gas is supplied as a plasma generating gas, film quality uniformity is also expected.

When $SiH_4$ gas is used as a Si raw material gas and $N_2$ gas is used as a nitrogen-containing gas, other ranges of conditions may be used as follows.

Processing temperature (the temperature of the surface of the susceptor 2): 200° C. to 400° C.

Processing pressure: 6.7 Pa to 100 Pa (50 mTorr to 750 mTorr)

$SiH_4$ gas flow rate: 10 ml/min (sccm) to 200 ml/min (sccm)

$N_2$ gas flow rate: 10 ml/min (sccm) to 200 ml/min (sccm)

Plasma generating gas flow rate: 0 ml/min (sccm) to 1000 ml/min (sccm)

Microwave power density: 2.43 W/cm$^2$ to 3.34 W/cm$^2$

Test Example

Next, test examples will be described.

Figure 6A:
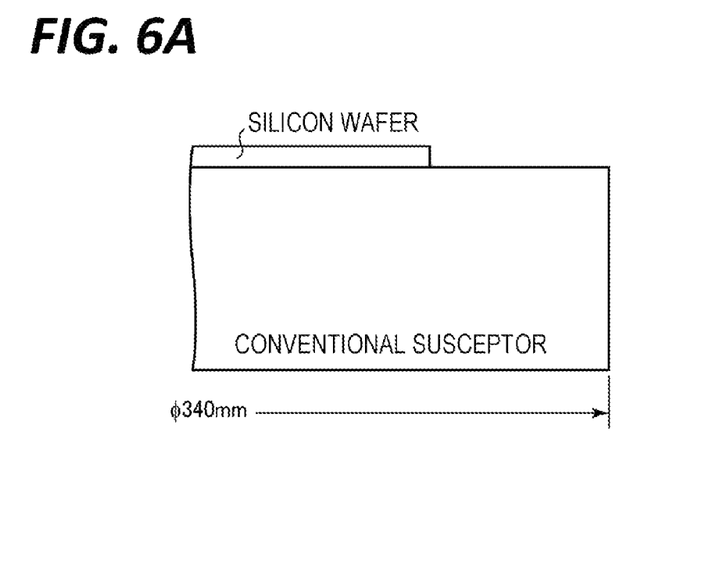
Figure 6B:
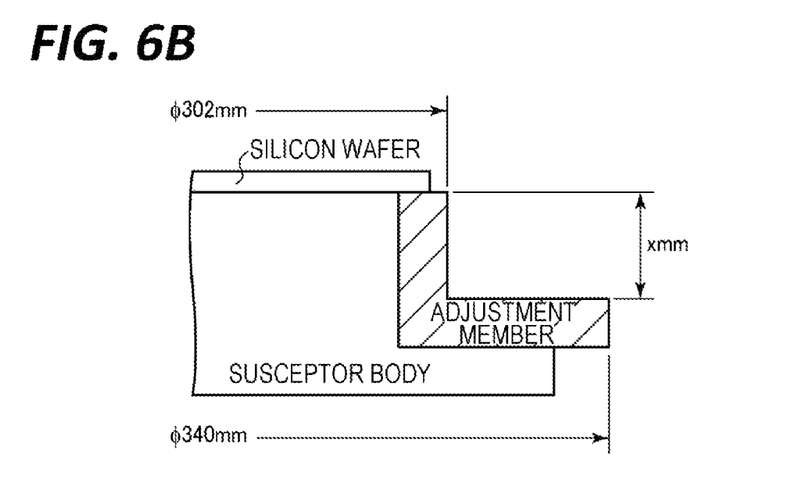

Here, with respect to a case where a conventional susceptor as illustrated in FIG. 6A was applied to the plasma film-forming apparatus illustrated in FIG. 1 and a case where a susceptor having an adjustment member provided with a stepped portion X (mm) as illustrated in FIG. 6B was applied to the plasma film-forming apparatus illustrated in FIG. 1, SiN films were formed on silicon wafers by plasma CVD. The stepped portions of the adjustment members were set to −4 mm and −8 mm.

In addition, the thickness of silicon wafers was set to 300 mm and the diameter of the susceptor was set to 340 mm.

Figure 7:
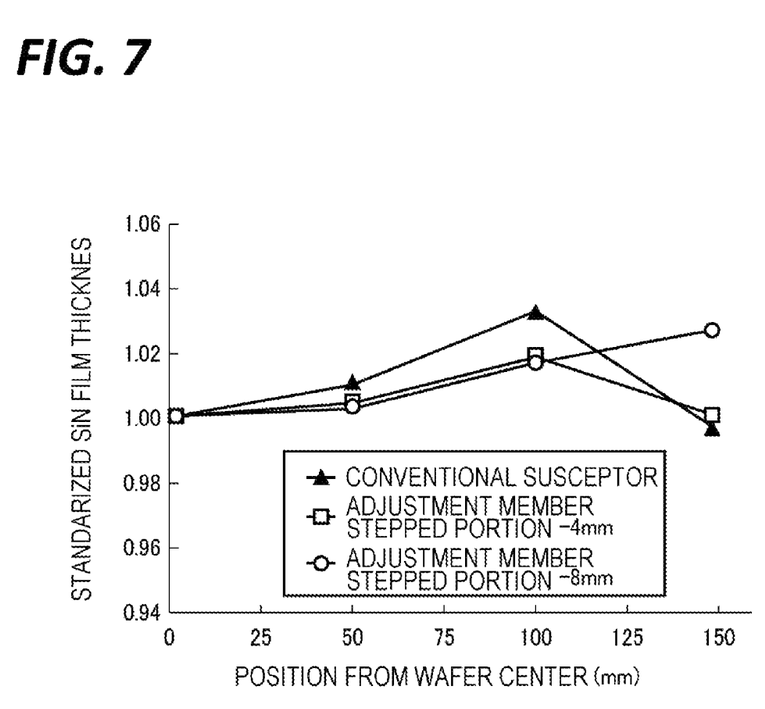
FIG. 7 is a view illustrating a relationship between the position from the center of the wafer and the film thickness of a standardized SiN film, with respect to a case in which the susceptor of FIG. 6A is used, a case in which the susceptor of FIG. 6B is used and the stepped portion X is −4 mm, and a case in which the susceptor of FIG. 6B is used and the stepped portion X is −8 mm.

In addition, the processing conditions were as follows.
$SiH_4$ gas flow rate: 90 sccm
$N_2$ gas flow rate: 70 sccm
Plasma generating gas: 0 sccm
Microwave power density: 3.2 W/cm$^2$
Processing time: 60 sec FIG. 7 illustrates a relationship between a position from the center of a wafer and the film thickness of a standardized SiN film in these cases. As illustrated in FIG. 7, it has been found that a deterioration in the film thickness uniformity of the SiN film on the outermost peripheral portion of the wafer is large in the case of using a conventional susceptor. On the contrary, when the adjustment member provided with the stepped portion X (mm) is disposed on the outer portion of the wafer, it is possible to suppress a deterioration in the film thickness uniformity of the SiN film on the outermost peripheral portion of the wafer. In the case where the stepped portion X of the adjustment member is set to −8 mm, it is possible to obtain a higher effect of suppressing a deterioration in the film thickness uniformity of the SiN film on the outermost peripheral portion of the wafer than the case where the stepped portion X of the adjustment member is set to −4 mm.

Next, with respect to a case where He gas was added as a plasma generating gas and a case where He gas was added, the film thickness uniformity and the film quality uniformity were investigated when a SiN film was formed under various processing conditions while changing the stepped portion X of the adjustment member.

The processing conditions were adjusted in the following ranges. In addition, in the case where He gas was added, the flow rate of He gas was set to a range of 200 sccm to 400 sccm.

Figure 8:
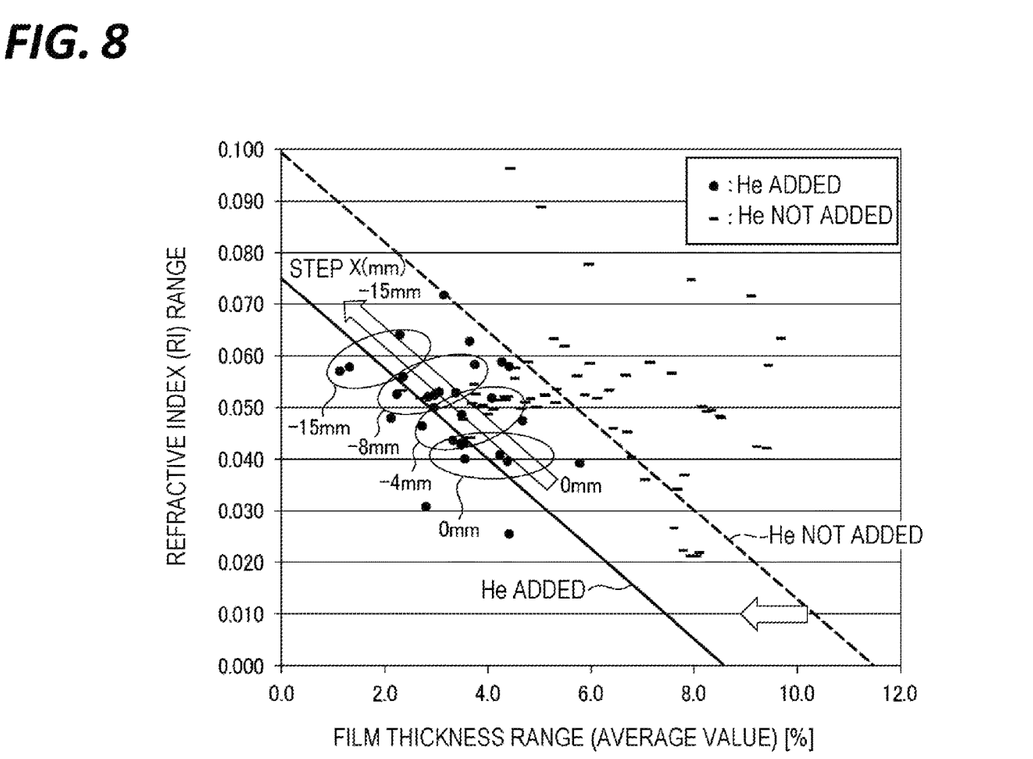
FIG. 8 is a view obtained by plotting average values (%) of film thickness ranges and refractive index (RI) ranges in a case where He gas is not added and in a case where He gas is added, in which the average values (%) of film thickness ranges and refractive index (RI) ranges are represented in comparison for respective stepped portions of the adjustment members in the case where He gas is added.

Film-Forming Conditions
$SiH_4$ gas flow rate: 10 sccm to 200 sccm
$N_2$ gas flow rate: 5 sccm to 200 sccm
Microwave power density: 2.43 W/cm$^2$ to 3.44 W/cm$^2$
Processing time: 15 sec to 200 sec The uniformity of the film thickness was obtained from the average value (%) of the film thickness range. In addition, the refractive index (RI) of the film was used as the index of the film quality, and the uniformity of the film quality was obtained from the refractive index range. FIG. 8 is a view obtained by plotting the average values (%) of the film thickness range and the refractive index (RI) ranges in each case.

As illustrated in FIG. 8, it has been found that, in the case where He gas is added, both the average values of the film thickness ranges and the refractive index ranges tend to be smaller than the case where the He gas was not added. In addition, it has been found that in the case where He gas is added, the average values of the film thickness ranges and the refractive index ranges are changed by the stepped portion of the adjustment member, and by adjusting the stepped portion of the adjustment member after the He gas is added, the film thickness uniformity of the SiN film may be further increased. Further, it has been found that, by combining the adjustment of the stepped portion of the adjustment member and the addition of He gas, it is possible to enhance not only the uniformity of film thickness, but also the uniformity of film quality.

<Other Applications>

While the exemplary embodiments of the present disclosure have been described with reference to the accompanying drawings, the present disclosure is not limited to the above-described exemplary embodiments, and various modifications may be made within the scope of the idea of the present disclosure.

For example, in the above-described exemplary embodiment, although a case where a SiN film is formed by plasma CVD using an RLSA (registered trademark) microwave plasma film-forming apparatus has been described as an example, the plasma may be any other type of microwave plasma, or may be plasma other than microwave plasma (e.g., inductively coupled plasma). In addition, the present disclosure is suitable for a film-forming processing using a gas containing H having a large Sole effect, for example, a film-forming process of a Si-containing film. In the exemplary embodiment, although a case where the present disclosure is applied to the film-forming of a SiN film using a Si raw material gas containing H has been described, the present disclosure is not limited to this case, and may be applied to the film-forming of another film using another raw material.

In addition, in the exemplary embodiment, although a case of using a semiconductor wafer as a substrate has been illustrated, the substrate is not limited to the semiconductor wafer, and may be another substrate such as, for example, a glass substrate or a ceramic substrate.

From the foregoing, it will be appreciated that various embodiments of the present disclosure have been described herein for the purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma film-forming apparatus comprising:
a chamber configured to accommodate a substrate therein;
a substrate pedestal configured to dispose the substrate thereon within the chamber;
a gas supply source configured to supply a gas including a film-forming gas into the chamber;
an exhaust configured to evacuate an inside of the chamber; and
a plasma generator configured to generate a plasma in the chamber,
wherein a predetermined film is formed on the substrate by exciting the film-forming gas by the plasma generated by the plasma generator,
the substrate pedestal includes a pedestal body having a substantially smaller diameter than that of the substrate and including a placement surface, and a selected annular adjustment member disposed outside the pedestal body, the annular adjustment member has a substantially larger diameter than that of the substrate at its top, and a diameter of the substrate is 300 mm,
the substrate pedestal is configured to accommodate the selected annular adjustment member having a predetermined height of a step according to a processing condition of a plasma processing,
the selected annular adjustment member is composed of a single body made of a single material,
the top of the selected annular adjustment member is a same height as the placement surface of the pedestal body, and
a portion of the top of the selected annular adjustment member is in direct contact with a lower surface of the substrate, and a remaining portion of the top and a side surface of the selected annular adjustment member are exposed to the plasma generated in the chamber.

2. The plasma film-forming apparatus of claim 1, wherein the plasma generator generates microwave plasma in the chamber.

3. The plasma film-forming apparatus of claim 2, wherein the plasma generator includes:
a microwave generator configured to generate microwaves;
a planar antenna having a slot configured to radiate the microwaves; and
a microwave transmitting plate formed of a dielectric material that constitutes a ceiling wall of the chamber, and microwave plasma is generated in the chamber by radiating the microwaves into the chamber through the slot of the planar antenna and the microwave transmitting plate to supply the microwaves into the chamber.

4. The plasma film-forming apparatus of claim 1, wherein the pedestal body includes a heater configured to heat the substrate.

5. The plasma film-forming apparatus of claim 1, wherein the gas supply source uses a hydrogen-containing gas as the film-forming gas.

6. The plasma film-forming apparatus of claim 5, wherein the film-forming gas includes a hydrogen-containing silicon raw material as the hydrogen-containing gas, and a silicon-containing film is formed as the predetermined film.

7. The plasma film-forming apparatus of claim 6, wherein the hydrogen-containing silicon raw material and a nitrogen-containing gas are supplied as the film-forming gas, and a silicon nitride film is formed as the predetermined film.

8. The plasma film-forming apparatus of claim 7, wherein the substrate pedestal controls a temperature of the substrate in a range of 250° C. to 550° C.

9. The plasma film-forming apparatus of claim 1, wherein the gas supply source supplies helium gas into the chamber as a plasma generating gas together with the film-forming gas.

10. The plasma film-forming apparatus of claim 1, wherein the selected annular adjustment member has a stepped structure having a lower annular portion with a first outer diameter and a higher annular portion with a second outer diameter, wherein the second outer diameter is smaller than the first outer diameter.

11. The plasma film-forming apparatus of claim 1, wherein the selected annular adjustment member is made of AlN.

12. A substrate pedestal configured to place a substrate thereon within a chamber of a plasma film-forming apparatus that forms a predetermined film on the substrate, the substrate pedestal comprising: a pedestal body having a substantially smaller diameter than that of the substrate and including a placement surface; and a selected annular adjustment member disposed outside the pedestal body, wherein the annular adjustment member has a substantially larger diameter than that of the substrate at its top, and a diameter of the substrate is 300 mm, the substrate pedestal is configured to accommodate the selected annular adjustment member having a predetermined height of a step according to a processing condition of a plasma processing, the selected annular adjustment member is formed with a single body made of a single material, the top of the selected annular adjustment member is a same height as the placement surface of the pedestal body, and a portion of the top of the selected annular adjustment member is in direct contact with a lower surface of the substrate, and a remaining portion of the top and a side surface of the selected annular adjustment member are exposed to the plasma generated in the chamber.

13. The substrate pedestal of claim 12, wherein the plasma film-forming apparatus includes a plasma generator configured to generate plasma, and microwave plasma is generated in the chamber by the plasma generator.

14. The substrate pedestal of claim 13, wherein the, plasma generator includes: a microwave generator configured to generate microwaves; a planar antenna having a slot configured to radiate the microwaves; and a microwave transmitting plate formed of a dielectric material that constitutes a ceiling wall of the chamber, and microwave plasma is generated in the chamber by radiating the microwaves into the chamber through the slot of the planar antenna and the microwave transmitting plate to supply the microwaves into the chamber.

15. The substrate pedestal of claim 12, wherein the pedestal body includes a heater configured to heat the substrate.

16. The substrate pedestal of claim 12, wherein a hydrogen-containing gas is used as a film-forming gas in a plasma film-forming.

17. The substrate pedestal of claim 16, wherein the film-forming gas includes a hydrogen-containing silicon raw material as the hydrogen-containing gas, and a silicon-containing film is formed as the predetermined film.

18. The substrate pedestal of claim 17, wherein the hydrogen-containing silicon raw material and a nitrogen-containing gas are supplied as the film-forming gas, and a silicon nitride film is formed as the predetermined film.

19. The substrate pedestal of claim 18, wherein the substrate pedestal controls a temperature of the substrate in a range of 250° C. to 550° C.

20. The substrate pedestal of claim 16, wherein, in the plasma film-forming, helium gas is supplied into the chamber as a plasma generating gas, together with the film-forming gas.

* * * * *